(12) United States Patent
Yonemitsu et al.

(10) Patent No.: US 8,220,141 B2
(45) Date of Patent: Jul. 17, 2012

(54) COMPONENT SUPPLY APPARATUS AND SURFACE MOUNTER

(75) Inventors: Masanori Yonemitsu, Iwata (JP); Tomokazu Ohnuki, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 629 days.

(21) Appl. No.: 12/444,530

(22) PCT Filed: Oct. 5, 2007

(86) PCT No.: PCT/JP2007/069580
§ 371 (c)(1),
(2), (4) Date: Apr. 6, 2009

(87) PCT Pub. No.: WO2008/044638
PCT Pub. Date: Apr. 17, 2008

(65) Prior Publication Data
US 2010/0071200 A1    Mar. 25, 2010

(30) Foreign Application Priority Data
Oct. 6, 2006   (JP) .................................. 2006-275509

(51) Int. Cl.
*B23P 19/00*   (2006.01)
(52) U.S. Cl. ............... 29/759; 29/739; 29/740; 29/741; 242/563; 242/563.2
(58) Field of Classification Search .................... 29/759, 29/426.3, 564.1, 739–741, 762; 242/563, 242/563.2; 720/632
See application file for complete search history.

(56) References Cited

U.S. PATENT DOCUMENTS

| 6,631,868 | B2 * | 10/2003 | Miller et al. | .................. 242/563 |
| 6,643,243 | B2 * | 11/2003 | Kurozuka et al. | ............. 720/632 |

FOREIGN PATENT DOCUMENTS

| EP | 0 859 543 A2 | 8/1998 |
| JP | 2000-114781 A | 4/2000 |
| JP | 2000-332489 A | 11/2000 |
| JP | 2004-228207 A | 8/2004 |
| JP | 2004-228604 A | 8/2004 |

OTHER PUBLICATIONS

The Extended European Search Report dated Nov. 4, 2010; Application No. 07829318.0-2214/ Patent No. 2077707 PCT/JP2007069580.

* cited by examiner

*Primary Examiner* — Thiem Phan
(74) *Attorney, Agent, or Firm* — Studebaker & Brackett PC; Donald R. Studebaker

(57) ABSTRACT

It is intended to allow for efficiently performing a feeder replacement operation. A feeder 50 is formed in a shape elongated in one direction to allow a replacement operation therefor to be performed in such a manner that it is inserted and pulled out relative to a feeder installation section 150, along a longitudinal direction thereof. A rear end 111 which is a trailing one of longitudinally opposite ends of each of a plurality of feeders 50A, 50B, - - -, in an insertion direction, is provided with a guide portion for guiding one 50C of the feeders to be installed in adjacent relation to ones of the remaining feeders. For example, the guide portion can be formed by rounding corners of the rear end 111 of the feeder 50.

7 Claims, 18 Drawing Sheets

WIDTHWISE DIRECTION 75,(77)

COMPONENT SUPPLY APPARATUS AND SURFACE MOUNTER

TECHNICAL FIELD

The present invention relates to a component supply apparatus for supplying components, such as ICs, using a tape as a carrier, and a surface mounter equipped therewith.

BACKGROUND ART

Heretofore, there has been known a surface mounter adapted to receive a supply of components from a tape feeder, and mount the components on a board carried on a conveyer. In this type of surface mounter, a plurality of tape feeders are arranged side-by-side for one surface mounter.
[Patent Document 1] JP 2000-114781A Recent years, it has been required to arrange as many tape feeders as possible for one surface mounter, to cope with diversification in components to be mounted, and improve productivity. In order to meet this requirement, it has been tried to arrange tape feeders at narrower installation intervals.

However, if the installation intervals of tape feeders are narrowed, the following problem will arise. As shown in FIG. 18, in case where an operation of replacing a tape feeder 2 is performed under a condition that other tape feeders 1 are installed on both sides thereof, if the tape feeder 2 to be replaced has a slight misalignment, interference between the tape feeders 1, 2 will occur in the area H in FIG. 18 as an insertion port. Specifically, a front end of the tape feeder 2 to be replaced is undesirably brought into contact with a rear end of one of the tape feeders 1 in an installed state. Thus, the tape feeder 2 is hardly inserted by a single operation to cause deterioration in efficiency of the tape-feeder replacement operation.

The present invention has been accomplished under the above circumstances, and it is an object of the present invention to allow for efficiently performing a tape-feeder replacement operation.

DISCLOSURE OF THE INVENTION

This technical object is achieved by a component supply apparatus of the present invention having the following elements.

Specifically, the present invention provides a component supply apparatus for supplying components from each of a plurality of component-supplying tape feeders adapted to be installed to a feeder installation section while being arranged side-by-side in a conveyance direction of a conveyer provided in a surface mounter, wherein each of the tape feeders is formed in a shape elongated in one direction to allow the installation thereof to be performed in such a manner that it is inserted and pulled out relative to the feeder installation section, along a longitudinal direction thereof, and wherein a trailing one of longitudinally opposite ends of each of the tape feeders in an insertion direction is provided with a guide portion for guiding installation of one of the tape feeders to be installed to the feeder installation section in adjacent relation to ones of the remaining tape feeders.

BEST MODE FOR CARRYING OUT THE INVENTION

First Embodiment

A first embodiment of the present invention will be described with reference to FIGS. 1 to 12.

1. General Configuration

Figure 1:
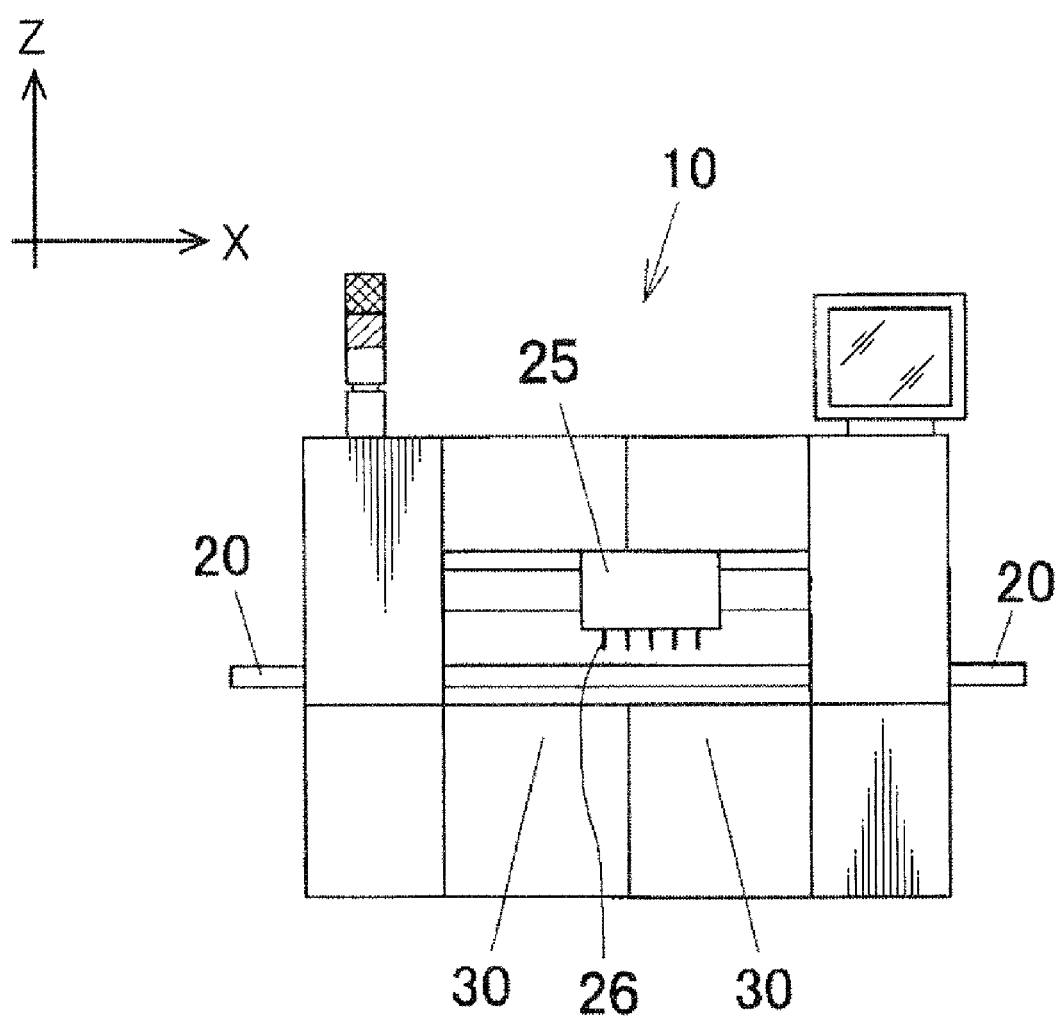
FIG. 1 is a front view of a surface mounter according to a first embodiment of the present invention.
Figure 2:
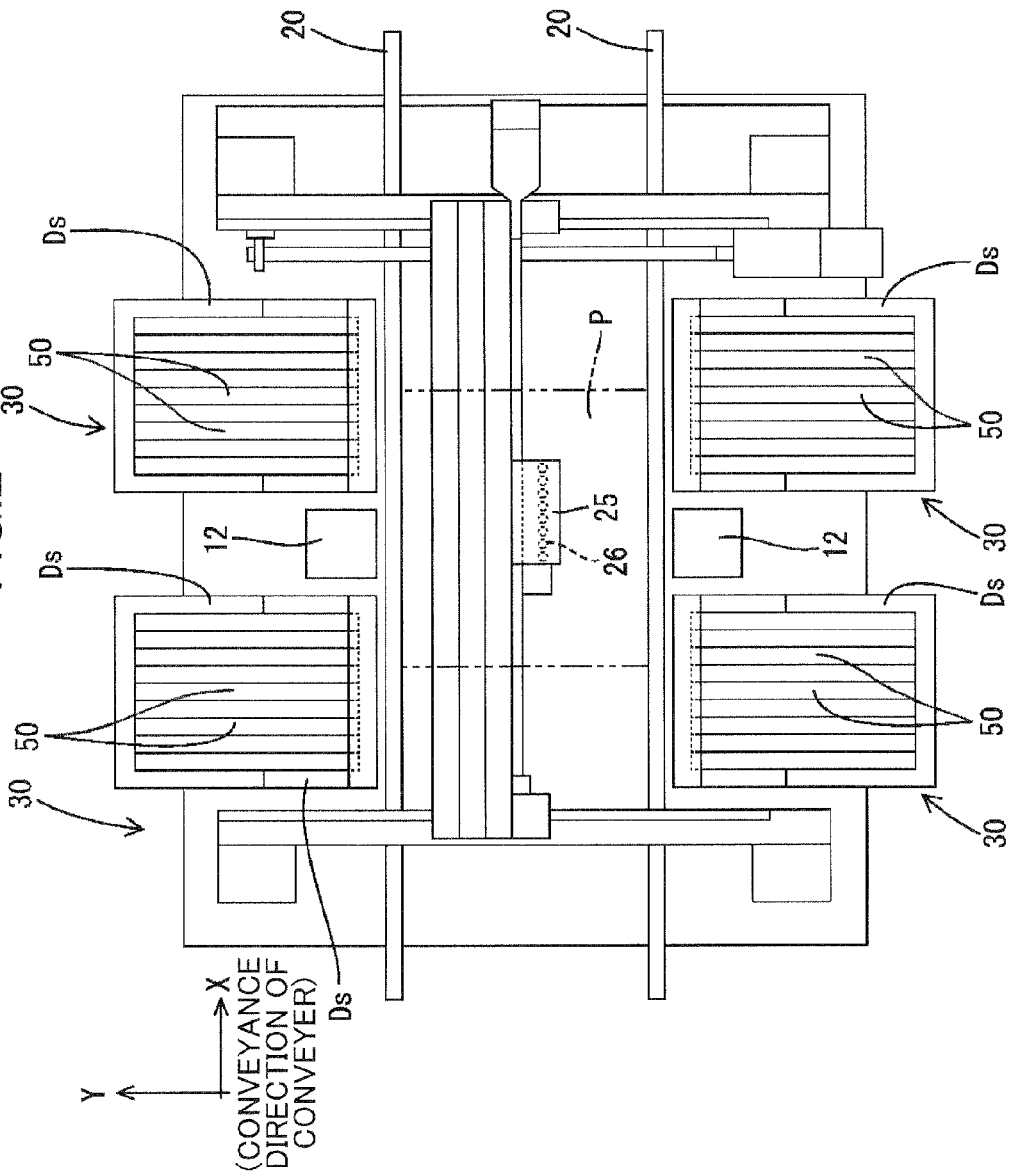
FIG. 2 is a top plan view of the surface mounter.

As shown in FIGS. 1 and 2, a surface mounter 10 comprises a conveyer 20 for conveying a printed circuit board P, a component supply apparatus 30 disposed on each of opposite lateral sides of the conveyer 20, and a head unit 25.

The component supply apparatus 30 is designed to supply components to be mounted onto the printed circuit board P, and attached to a mounter body of the surface mounter 10 through a carriage Ds.

The head unit 25 takes on a function of picking up a component from the component supply apparatus 30 and transferring the component onto the printed circuit board P, wherein it is adapted to be movable in a region ranging from the component supply apparatus 30 to a mounting position on the printed circuit board P, under driving of a drive mechanism using a servomotor or the like.

The head unit 25 includes a plurality of heads 26 each of which has a distal end provided with a suction nozzle for suction-holding a component and attaching the component to the printed circuit board P. Each of the nozzles is designed to receive a supply of a negative pressure from negative-pressure generating means (not shown) during a component pickup operation, and pick up a component by a suction force based on the negative pressure.

The reference numeral 12 in FIG. 2 indicates a camera. The camera 12 takes on a function of imaging a component picked up by the head 26 to check whether a posture of the picked-up component is adequate.

In the surface mounter 10 configured as above, the head unit 25 is firstly moved to a position above an end of the component supply apparatus 30 on the side of the conveyer 20 to pick up components from the component supply apparatus 30.

Then, after completion of the component pickup operation by the head 26, the presence or absence of misalignment in component pickup position is checked by the camera 12.

Then, the picked-up components are transferred by the head unit 25. During the transfer operation, the misalignment in component pickup position is corrected with respect to each of the heads 26. Then, when the head 26 reaches a given component-attaching position, it is moved up and down, and the component is mounted onto the printed circuit board P according to the up-and-down movement.

2. Component Supply Apparatus a) General Configuration

Figure 3:
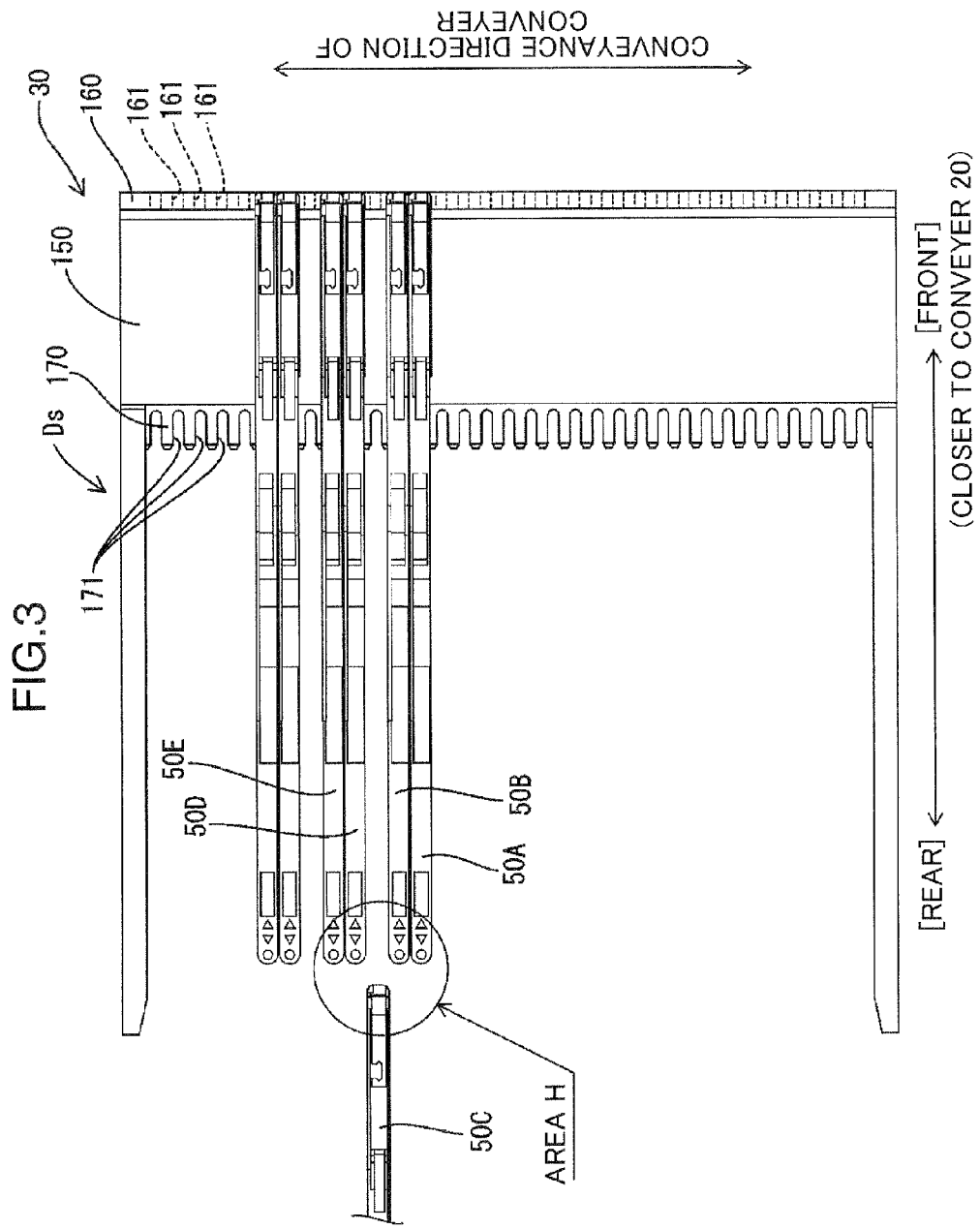
FIG. 3 is a top plan view of a carriage and a component supply apparatus.

As shown in FIGS. 2 and 3, the component supply apparatus 30 comprises a plurality of component-supplying tape feeders 50 (50A, 50B, 50C, - - - ) arranged side-by-side along a conveyance direction (X direction) of the conveyer 20. Each of the tape feeders 50 (hereinafter referred to as "feeder" for short) is detachably installed to the cartridge Ds. In the following description, the term "feeder 50A (or 50B, 50C, - - - )" will be used to refer to a specific one of the plurality of feeders, and the term "feeder 50" will be used in other cases (to refer to an arbitrary one of the feeders).

As shown in FIG. 3, a feeder installation section 150 is provided on a front portion (in FIG. 3, on a right side) of the carriage Ds. The feeder installation section 150 is set to extend along the conveyance direction (in FIG. 3, in an upward-downward direction) of the conveyer 20.

The feeder installation section 150 has a front end provided with a vertical wall 160 standing in a vertical direction, and a rear end provided with a horizontal wall 170 extending in a horizontal direction. The vertical wall 160 has a plurality of positioning holes 161 formed therein along a longitudinal direction (in FIG. 3, in the upward-downward direction) of the feeder installation section 150 at constant intervals to position each of the feeders 50 during an installation operation therefor, and the horizontal wall 170 has a plurality of positioning grooves 171 formed therein along the longitudinal direction (in FIG. 3, in the upward-downward direction) of the feeder installation section 150 at constant intervals to position each of the feeders 50.

In the first embodiment, an operation of replacing each of the feeders 50 is performed in such a manner that the feeders 50 is slidingly moved relative to the feeder installation section 150 along a frontward-rearward direction (in FIG. 3, in a rightward-leftward direction), as will be described in detail later.

Figure 5:
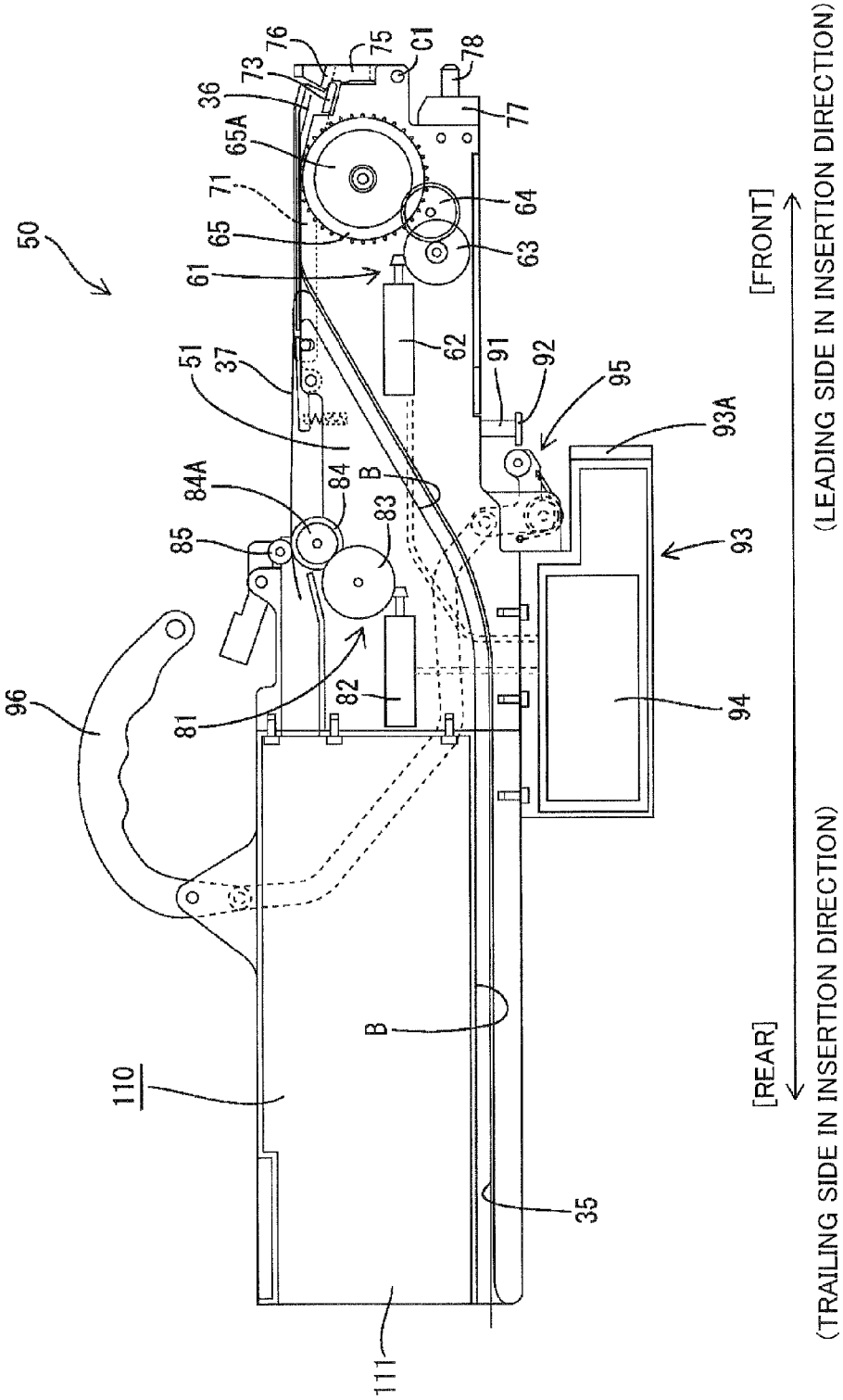
FIG. 5 is a front view of a feeder.

As shown in FIG. 5, the feeder 50 is primarily made up of a feed-out device 61, a pulling device 81, and a feeder body 51 to which these devices are fixed, and designed to feed out an after-mentioned component supply tape 35 to supply components.

Figure 4:
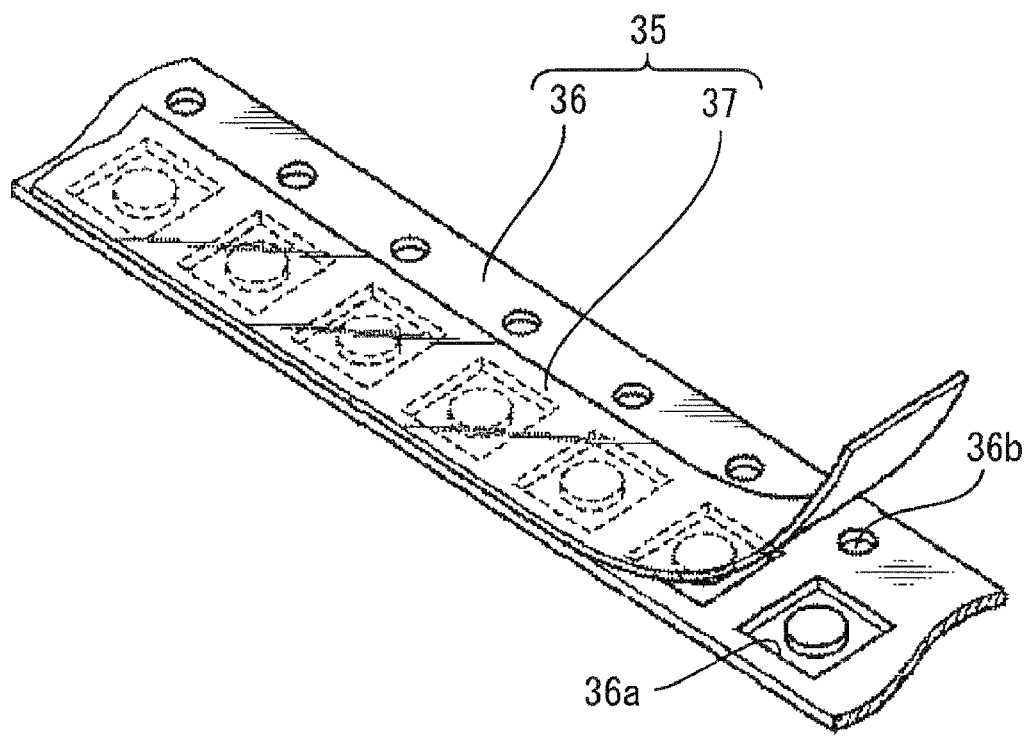
FIG. 4 is a perspective view of a component supply tape.

The component supply tape 35 has a structure as shown in FIG. 4, which comprises a carrier tape 36, and a cover tape 37 attached to the carrier tape 36. The carrier tape 36 has a plurality of cavity-like component storage portions 36a opened upwardly and arranged at constant intervals, and a component, such as IC, is stored in each of the component storage portions 36a. Further, the carrier tape 36 has a plurality of engagement holes 36b provided in one of opposite edge regions along an edge thereof at constant intervals. The component supply tape 35 is wound and supported by a reel (not shown) at a rearward position of the feeder 50.

As shown in FIG. 5, the feeder body 51 has a shape elongated in the frontward-rearward direction (in FIG. 5, in a rightward-leftward direction), and a housing 110 made of a resin material is installed to a rear end thereof. The feeder body 51 and the housing 110 are provided with a feed path B for allowing the component supply tape 35 to travel therethrough. The feed path B extends frontwardly from a lower region of a rear end of the housing 110 straight and horizontally and connects to the feeder body 51. Then, the feed path B extends upwardly to an upper end of a front portion of the feeder body 51 while taking a route directed obliquely frontwardly.

The feed-out device 61, a tape holder 71 and a holder retention plate 75 as will be described below are disposed on a frontward side of the feeder body 51 with respect to the feed path B, and the pulling device 81 is provided on the other side with respect to the feed path B.

The feed-out device 61 takes on a function of allowing the component supply tape 35 to be unreeled from a reel (not shown), and comprises a first motor 62, a gear 63, a gear 64, a gear 65A, and a sprocket 65 integrated with the gear 65A. The sprocket 65 is disposed in an upper region of a front end of the feeder body 51, and the gears 63, 64 and the first motor 62 are disposed below and rearward of the sprocket 65.

The tape holder 71 is formed in a shape elongated in the frontward-rearward direction, and installed to the upper end of the front portion of the feeder body 51. The tape holder 71 is designed to press an upper surface of the carrier tape 36 so as to restrain jump-out of the components therefrom. The tape holder 71 has a turnaround portion 72 (see FIG. 6) provided at a position on the side of a rear end thereof to allow the cover tape 37 to be turned rearwardly.

The holder retention plate 75 takes on a function of retaining the tape holder 71. The holder retention plate 75 is attached to the front end of the feeder body 51 through a hinge C1. The holder retention plate 75 is formed in a block-like shape having an upper portion provided with a pressing portion 76.

The holder retention plate 75 is adapted, when it is in a standing position as shown in FIG. 5, to allow the pressing portion 76 to come into engagement with a front end 73 of the tape holder 71 so as to lock the tape holder 71. Further, the holder retention plate 75 is adapted to be swingably moved about the hinge C1 at a lower end thereof, from the upstanding position in the frontward direction of the apparatus, so as to release the locked state of the tape holder 71 by the pressing portion 76 to allow the tape holder 71 to be detached.

A lower region of the front end of the feeder body 51 located below the holder retention plate 75 is cut out concavedly in the rearward direction of the apparatus. A block 77 having a positioning pin 78 is installed in the cut-out space. The positioning pin 78 is adapted to be paired with one of the positioning holes 161 of the carriage Ds.

Returning to FIG. 5, the pulling device 81 will be described below. The pulling device 81 takes on a function of peeling off the cover tape 37 from the carrier tape 36 along with unreeling of the component supply tape 35, to expose the components, and a function of pulling the peeled cover tape 37, and comprises a second motor 82, a gear 83, a gear 84A, a pulling roller 84 integrated with the gear 84A, and a pinch roller 85.

The pinch roller 85 and the pulling roller 84 are in close contact with each other, so that, in response to activation of the second motor 82, a force in a pulling direction is applied to the cover tape 37 turned in the rearward direction of the apparatus by the turnaround portion 72, based on a frictional force between the rollers 84, 85.

Further, a vertical pin 91, a lock device 95 and a control box 93 are provided at a position below and on the side of the rear end of the feeder body 51.

The vertical pin 91 is adapted to be paired with one of the positioning grooves 171 of the carriage Ds. The vertical pin 91 has a pin diameter set at a value allowing the vertical pin 91 to be fitted in the positioning groove 171 with a slight clearance therebetween. The vertical pin 91 has a lower portion provided with a retaining flange 92.

The lock device 95 is designed to fix the feeder 50 to the carriage Ds. In the first embodiment, a manual operation arm 96 is linked to the lock device 95, so that a lock operation and a lock release operation can be performed by manually operating the manual operation arm 96.

The control box 93 houses a control board 94, and has a connector 93A installed at a front end thereof. The connector 93A is adapted, when the feeder 50 is installed to the carriage Ds, to be electrically connected to a counterpart connector so as to allow electric power and various control signals to be input from the surface mounter 10 through the carriage Ds. The control board 94 is designed to generally control an operation of the feeder 50, in cooperation with a control unit of the surface mounter 10.

b) Shapes of Front and Rear Ends of Feeder

Figure 6:
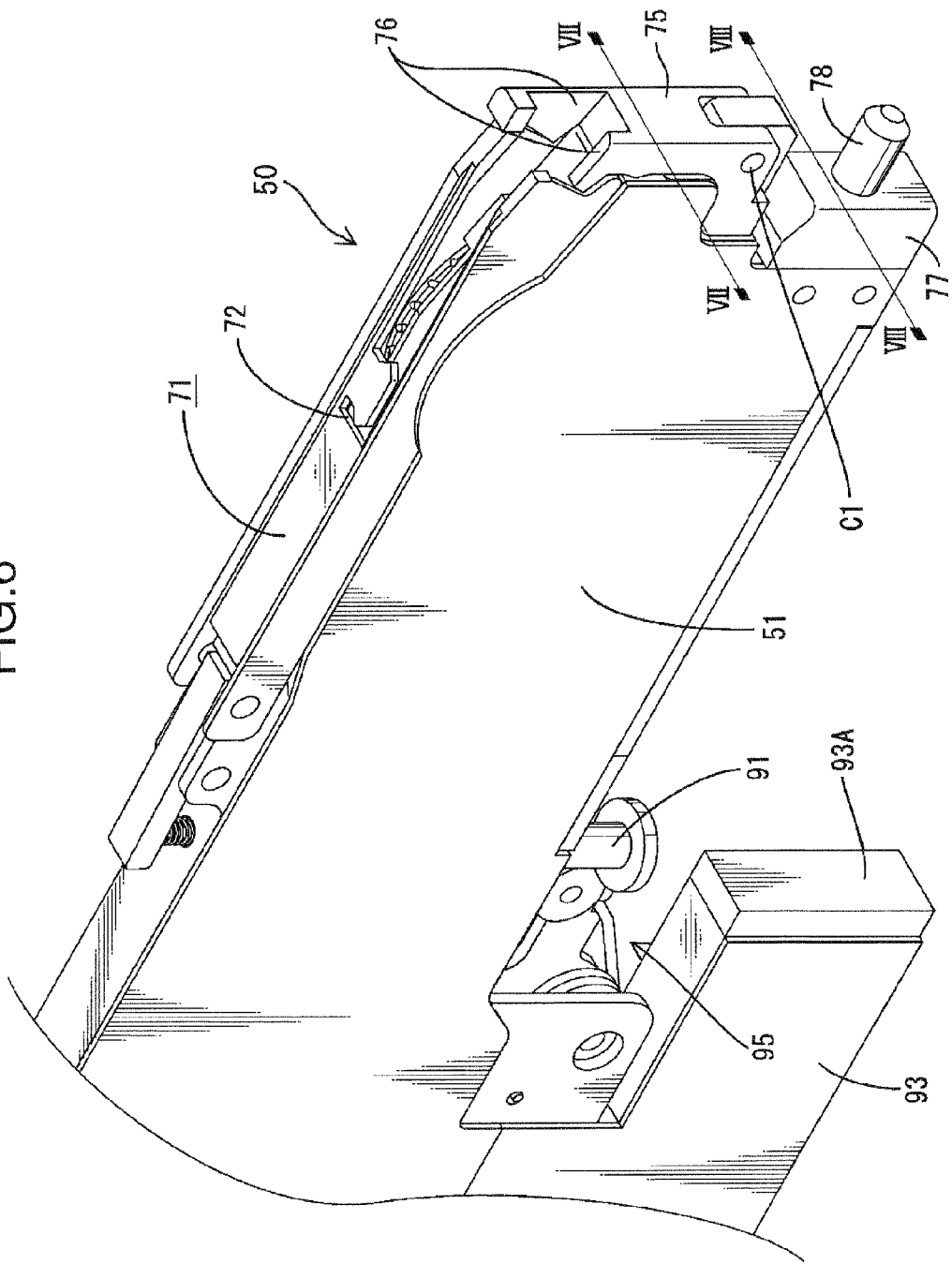
FIG. 6 is a perspective view of a front portion of the feeder.

FIG. 6 is a perspective view showing the front end of the feeder 50. As shown in FIG. 6, the holder retention plate 75 and the block 77 are disposed at the front end of the feeder 50. Each of the holder retention plate 75 and the block 77 has a corner formed in an arc shape over an overall height dimension thereof.

Figure 7:
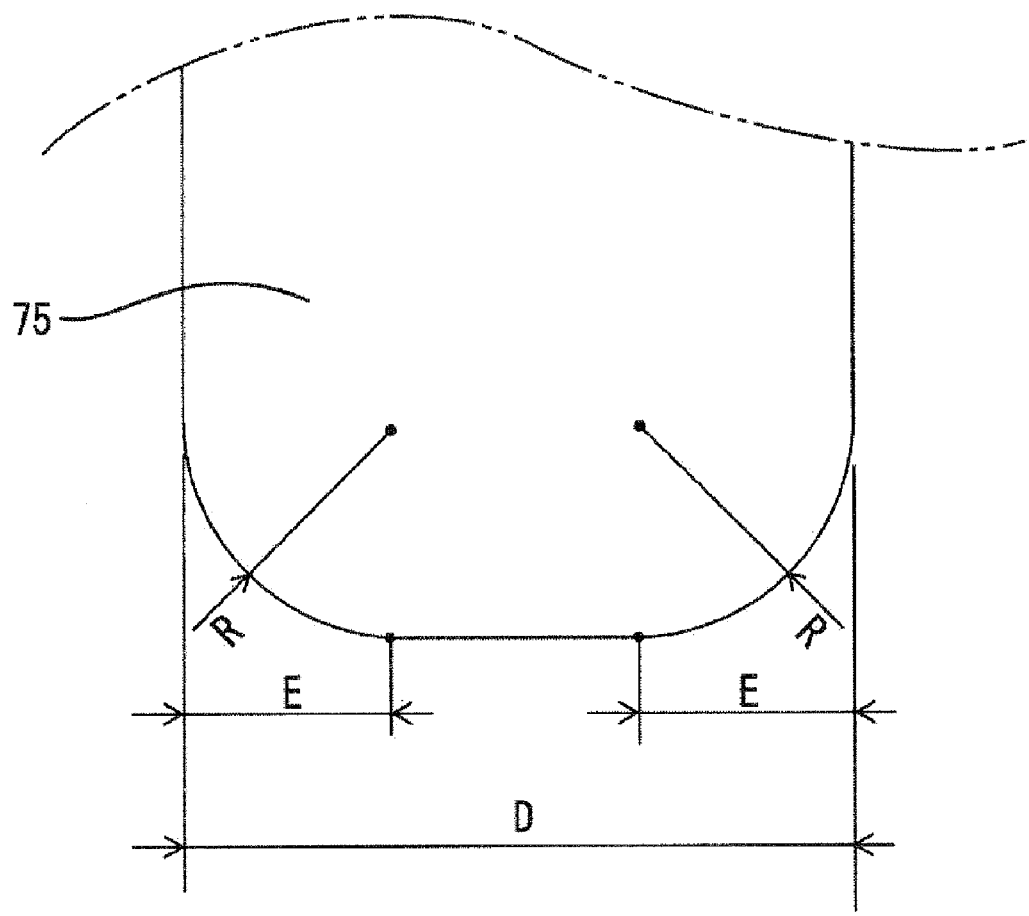
FIG. 7 is a sectional view taken along the line VII-VII in FIG. 6.
Figure 8:
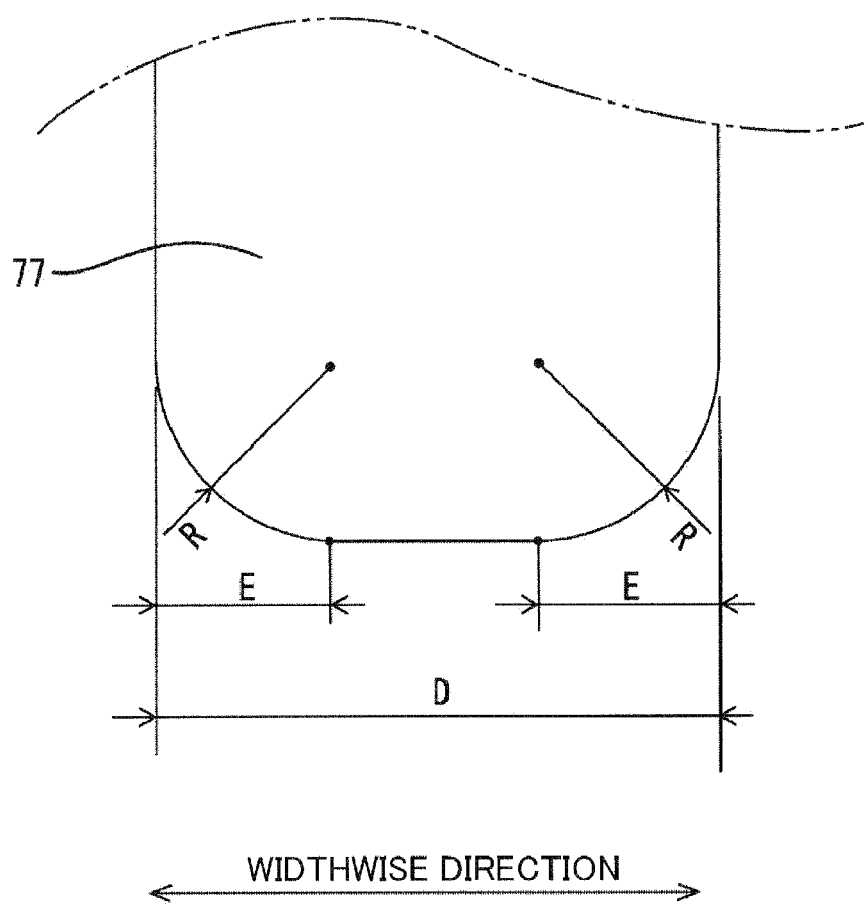
FIG. 8 is a sectional view taken along the line VIII-VIII in FIG. 6.

A specific shape of the corner is as shown in FIGS. 7 and 8. In the first embodiment, each of the holder retention plate 75 and the block 77 has two corners located on widthwisely opposite sides thereof and each formed to have a roundness with a radius R.

A size (in FIGS. 7 and 8, the dimension E) of the roundness is increased as largely as possible. Specifically, in the block 77, a space for installing the positioning pin 78 is ensured as a straight portion, and a remaining region other than the straight portion is formed in an arc shape. Preferably, a specific value of the size (the dimension E) of the roundness is set to be one-third or more of an overall width D of the feeder 50.

Figure 9:
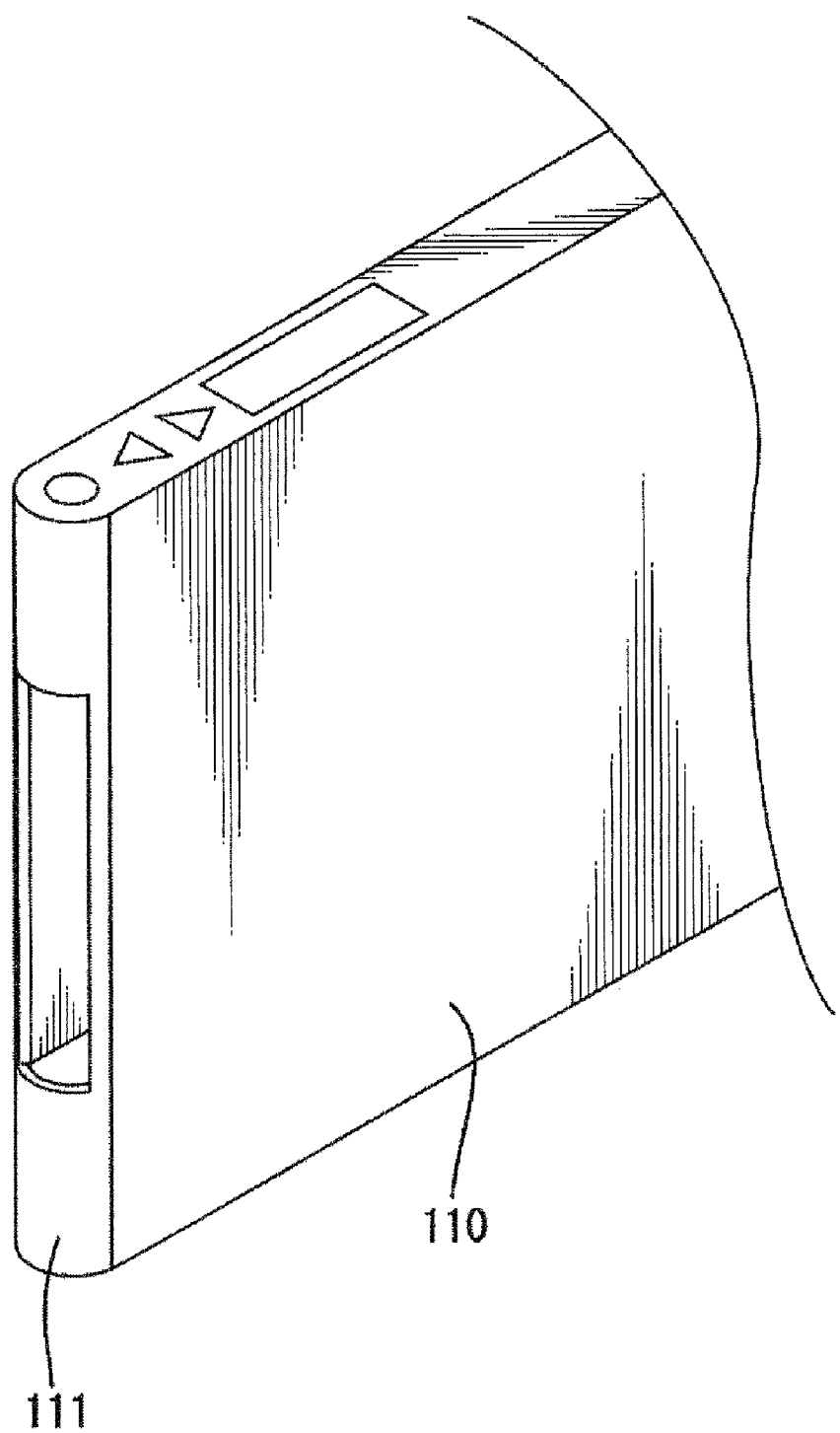
FIG. 9 is a perspective view of a rear portion of the feeder.
Figure 10:
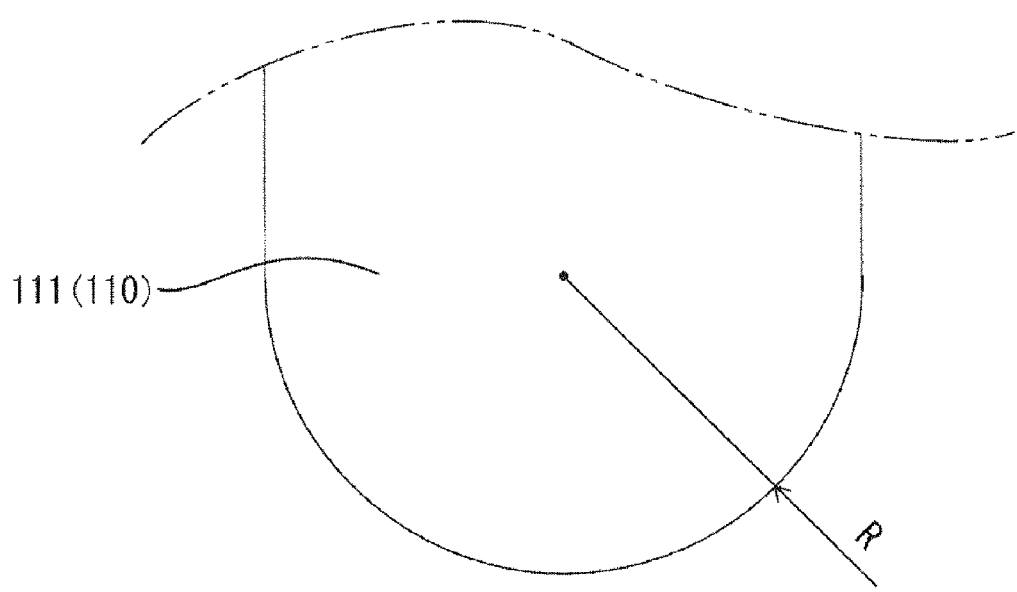
FIG. 10 is a horizontal sectional view of the rear portion of the feeder.

FIG. 9 is a perspective view showing the rear end of the feeder 50, i.e., the rear end 111 of the housing 110. As shown in FIG. 9, the rear end 111 of the housing 110 is rounded over an overall height dimension thereof, in the same manner as that for the front end of the feeder 50. A specific shape of the rear end 111 is as shown in FIG. 10. In this embodiment, the rear end 111 is formed in a semicircular shape as a whole.

The "trailing one of longitudinally opposite ends of each of the tape feeders in an insertion direction" in the appended claims corresponds to the rear end 111 of the housing 110 illustrated in FIG. 9 in the first embodiment. Further, the "guide portion" in the appended claims is made up of the rounded portion (arc-shaped portion) formed in the rear end 111.

3. Feeder Installation Operation

A feeder installation operation to be performed during replacement of the feeder 50 will be described below by taking the feeder 50C in FIG. 3 as an example.

In an operation of installing the feeder 50C to the carriage Ds, a position of the feeder 50C is adjusted such that the feeder 50C is located between the feeder 50B and the feeder 50D.

After completion of the position adjustment, the feeder 50C is inserted toward the feeder installation section 150 of the carriage Ds.

If the position of the feeder 50C is properly adjusted to be located between the feeder 50B and the feeder 50D, the front end of the feeder will be inserted between the feeders 50B, 50D without problems.

Once the front end of the feeder 50C is inserted between the feeders 50B, 50D, the feeder 50C can be readily inserted in the frontward direction of the apparatus along respective sidewalls of the two feeders 50B, 50D.

Figure 11:
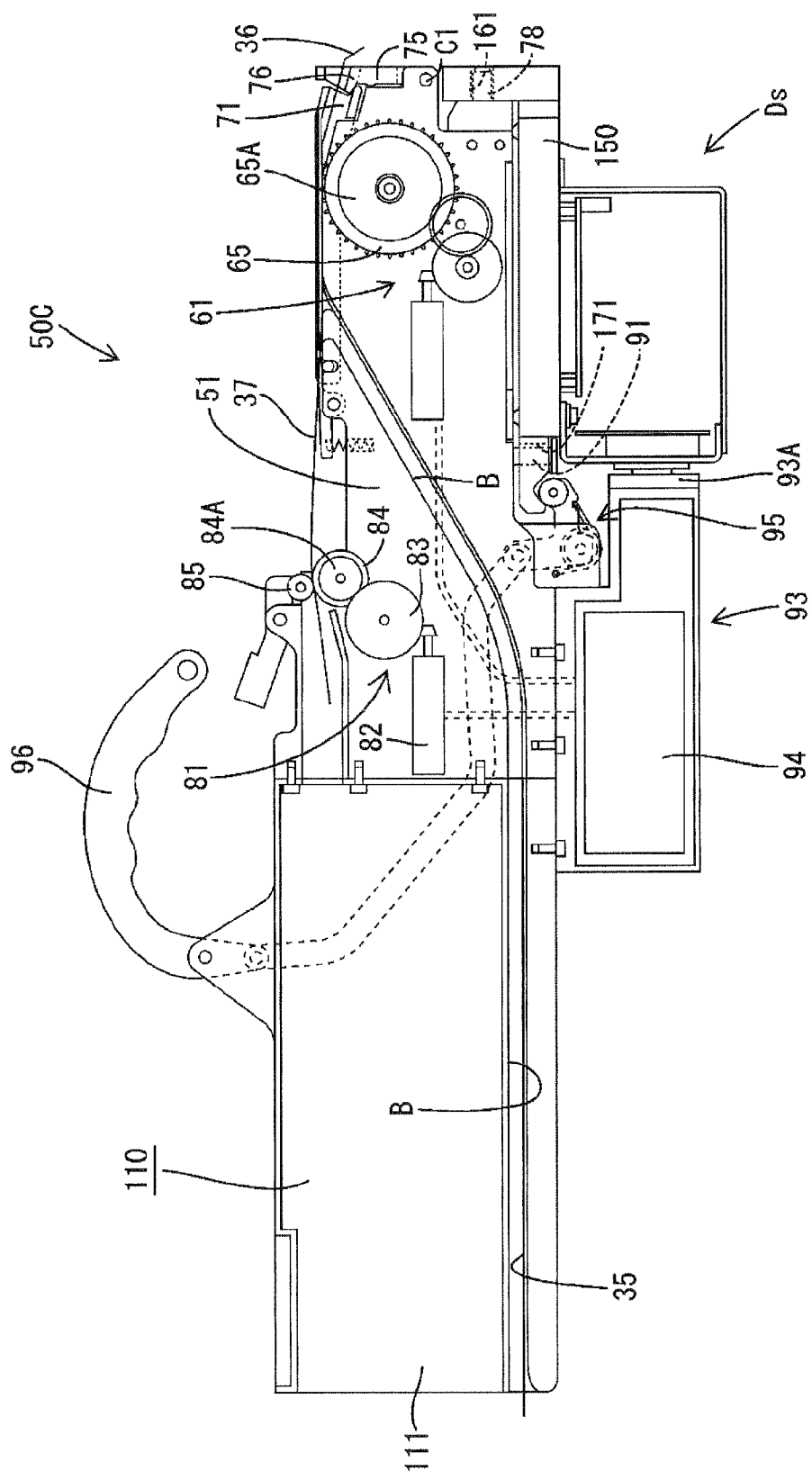
FIG. 11 is a diagram showing a state after the feeder is installed to the cartridge.

Then, when the front end of the feeder 50C reaches the feeder installation section 150, the positioning pin 78 provided on the front end of the feeder body 51 is fitted into one of the positioning holes 161 of the carriage Ds, and the vertical pin 91 provided on a bottom of a rear portion of the feeder body 51 is fitted into one of the positioning grooves 171 of the carriage Ds, as shown in FIG. 11.

Thus, the feeder 50C is positioned through the two elements located on the front and rear sides thereof. Then, after the positioned feeder 50C is locked relative to the carriage Ds by the lock device 95, the replacement operation is completed.

Figure 12:
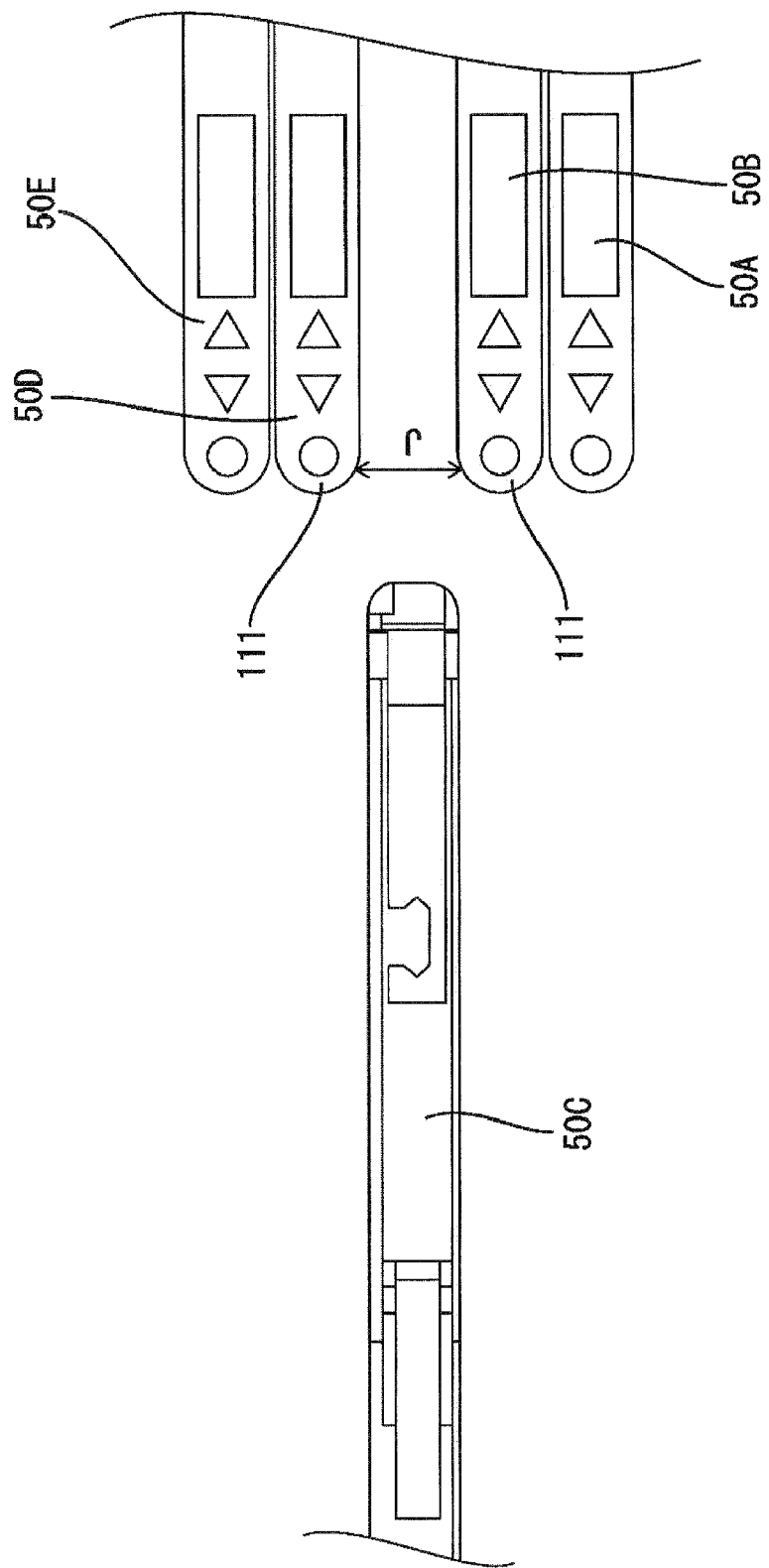
FIG. 12 is an enlarged view of the area H in FIG. 3.

During the above insertion operation, if a widthwise position of the feeder 50C is displaced from a space between the feeders 50B, 50D to be located on both sides of the feeder 50C, the front end of the feeder 50C will be brought into contact with one of the rear ends of the feeders 50B, 50D. However, in the first embodiment, as shown in FIG. 12, an insertion port defined between the feeders 50B, 50D has a width (in FIG. 12, the dimension J) which gradually increases toward edges (rearmost edges of the feeders 50B, 50D), because each of the rear ends of the feeders 50B, 50D is formed in an arc shape. In addition, the front end of the feeder 50C is also formed in an arc shape.

Therefore, after the feeder 50C is brought into contact with either one of the rear ends 111 of the feeders 50B, 50D, it is guided inwardly (in FIG. 12, rightwardly) along a wall surface of the rear end 111. Thus, even if there is a slight misalignment, the front end of the feeder 50C can be inserted between the feeders 50B, 50D without difficulty.

Once the front end of the feeder 50C is inserted between the feeders 50B, 50D, the feeder 50C can be readily inserted in the frontward direction of the apparatus along the sidewalls of the feeders 50B, 50D. Thus, the replacement operation can be completed after the feeder 50C is locked relative to the feeder installation section 150 in the aforementioned manner.

4. Advantages

As above, according to the first embodiment, even if the feeder 50C has a slight misalignment, the feeder 50C can be inserted between the feeders 50B, 50D without difficulty. This makes it possible to smoothly perform the operation of installing the feeder 50C to the carriage Ds.

In the first embodiment, the rear end 111 of the housing 110 is formed in a semicircular shape as a whole to allow the width (in FIG. 12, the dimension J) of the insertion port illustrated in FIG. 12 to be increased as largely as possible on the side of the edge. Alternatively, a part of the rear end 111 may be left as a straight portion, i.e., the rear end 111 may be formed in the same shape as that of the front end of the feeder 50 (the retention plate 75 and the block 77) illustrated in FIGS. 7 and 8. In this case, a size (corresponding to the dimension E in FIGS. 7 and 8) of a roundness formed in each corner of the rear end 111 is preferably set to be one-third or more of an overall width D of the feeder 50, as described above. This makes it possible to effectively guide the front end of the feeder 50 during an installation operation therefor so as to more smoothly perform the installation operation for the feeder 50.

Second Embodiment

Figure 13:
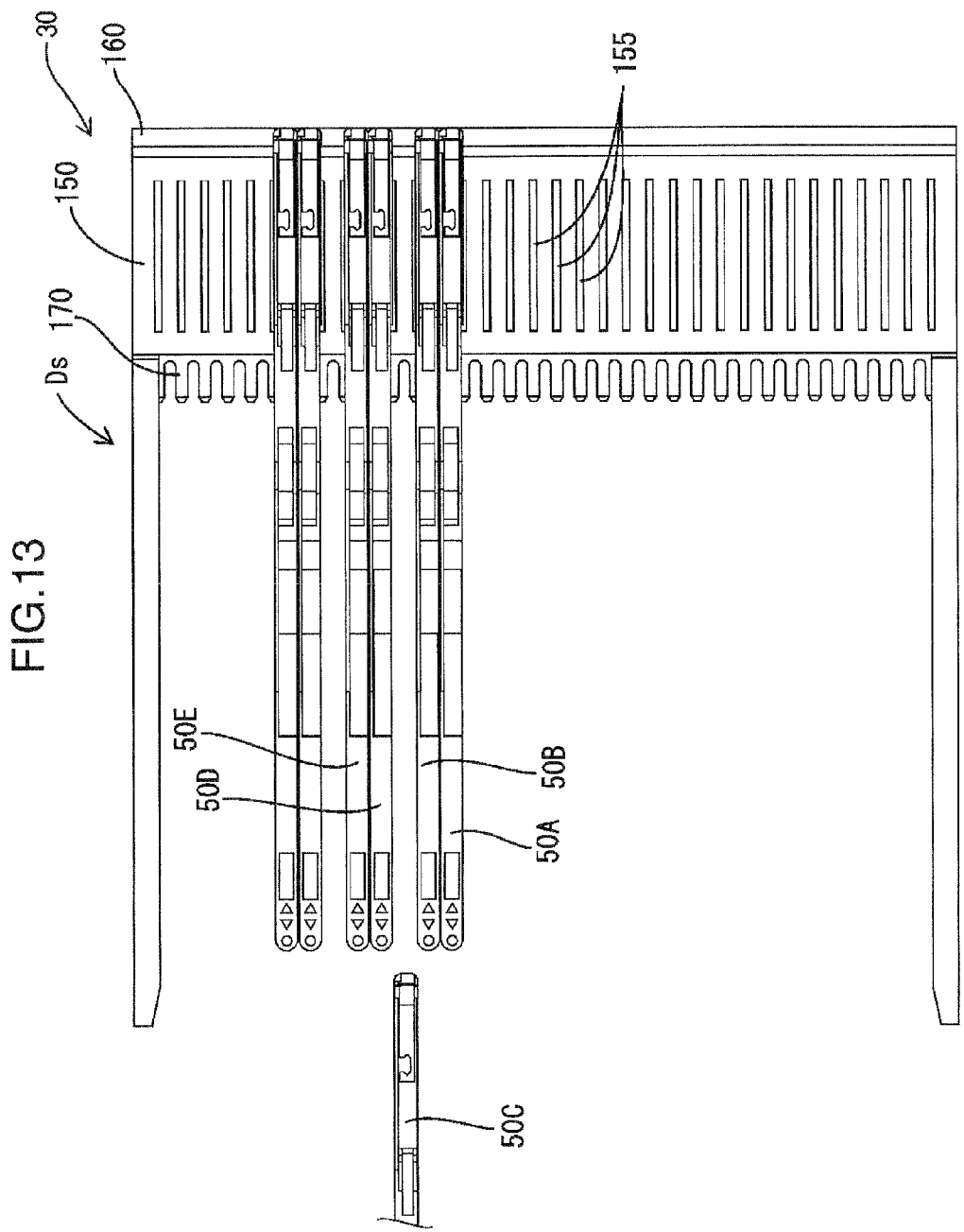
FIG. 13 is a top plan view of a carriage and a component supply apparatus in a second embodiment.

A second embodiment of the present invention will be described below based on FIG. 13.

In the second embodiment, a plurality of guide plates 155 are provided in the feeder installation section 150 of the carriage Ds. Each of the guide plates 155 is formed in a straight shape extending along the longitudinal direction (in FIG. 13, in the rightward-leftward direction) of the feeder 50, and provided between adjacent ones of respective installation spaces of the feeders 50. Each of the guide plates 155 is adapted to guide the feeder 50 from widthwisely opposite sides thereof, in cooperation with an adjacent one of the remaining guide plates 155.

In the above configuration, the feeder 50C is kept in a proper posture during the operation of installing the feeder 50C to the carriage Ds. This makes it possible to suppress the occurrence of defective fitting engagement between the positioning pin 78 and one of the positioning holes 161 of the carriage Ds in the front portion of the feeder 50C, and suppress the occurrence of defective fitting engagement between the vertical pin 91 and one of the positioning grooves 171 of the carriage Ds in the rear portion of the feeder 50C, so that the operation of installing the feeder 50 to the carriage Ds can be more smoothly performed.

Third Embodiment

Figure 14:
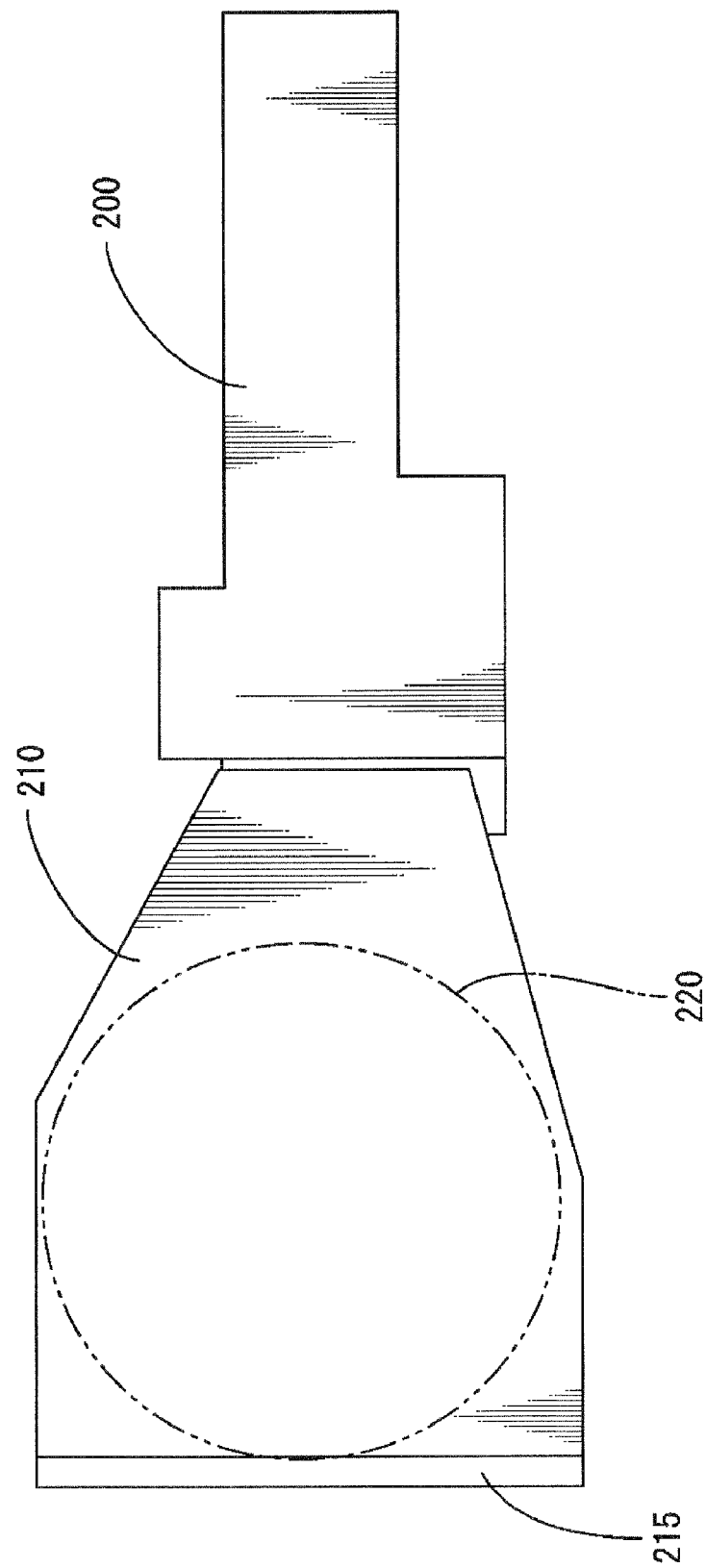
FIG. 14 is a front view of a feeder in a third embodiment.
Figure 15:
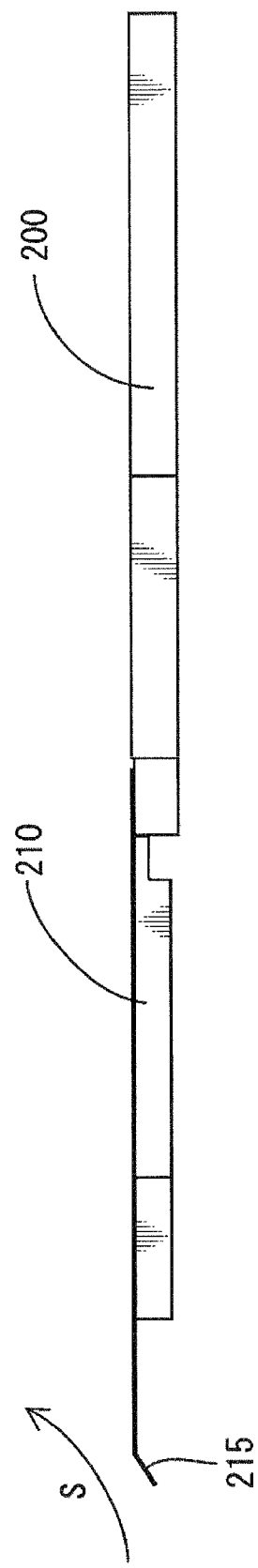
FIG. 15 is a top plan view of a feeder.

With reference to FIGS. 14 and 15, a third embodiment of the present invention will be described below.

The first embodiment has been described by taking an electrically-operated feeder as an example. Differently, a feeder in the third embodiment is a pneumatic type, and a reel retention member 210 is provided at a rear end of a feeder body 200 to retain a reel 220.

The reel retention member 210 is made of a metal material, and formed and arranged to extend along a longitudinal direction of the feeder. Further, a rear end of the reel retention member 210 has a bent portion 215 which is bent inwardly in a widthwise direction of the feeder and formed to extend over an overall height dimension of the reel retention member 210. Specifically, as shown in FIG. 15, the bent portion 215 is bent to extend obliquely rearwardly.

As above, a rear end of the feeder is bent inwardly in the widthwise direction of the feeder to provide the bent portion 215. Thus, when an adjacent one of the feeders is brought into contact of the bent portion 215, the adjacent feeder is guided in a direction indicated by the arrowed line S in FIG. 15 along an inclination of the bent portion 215, so as to obtain the same advantage as that in the first embodiment. That is, the "guide portion" in the appended claims is made up of the bent portion 215 provided at the rear end of the feeder in the third embodiment.

Other Embodiments

The present invention is not limited to the above embodiments described and illustrated in the figures. For example, the following embodiments are also includes in the technical scope of the present invention, and various changes and modifications may further be made therein without departing from the scope of the present invention.

Figure 16:
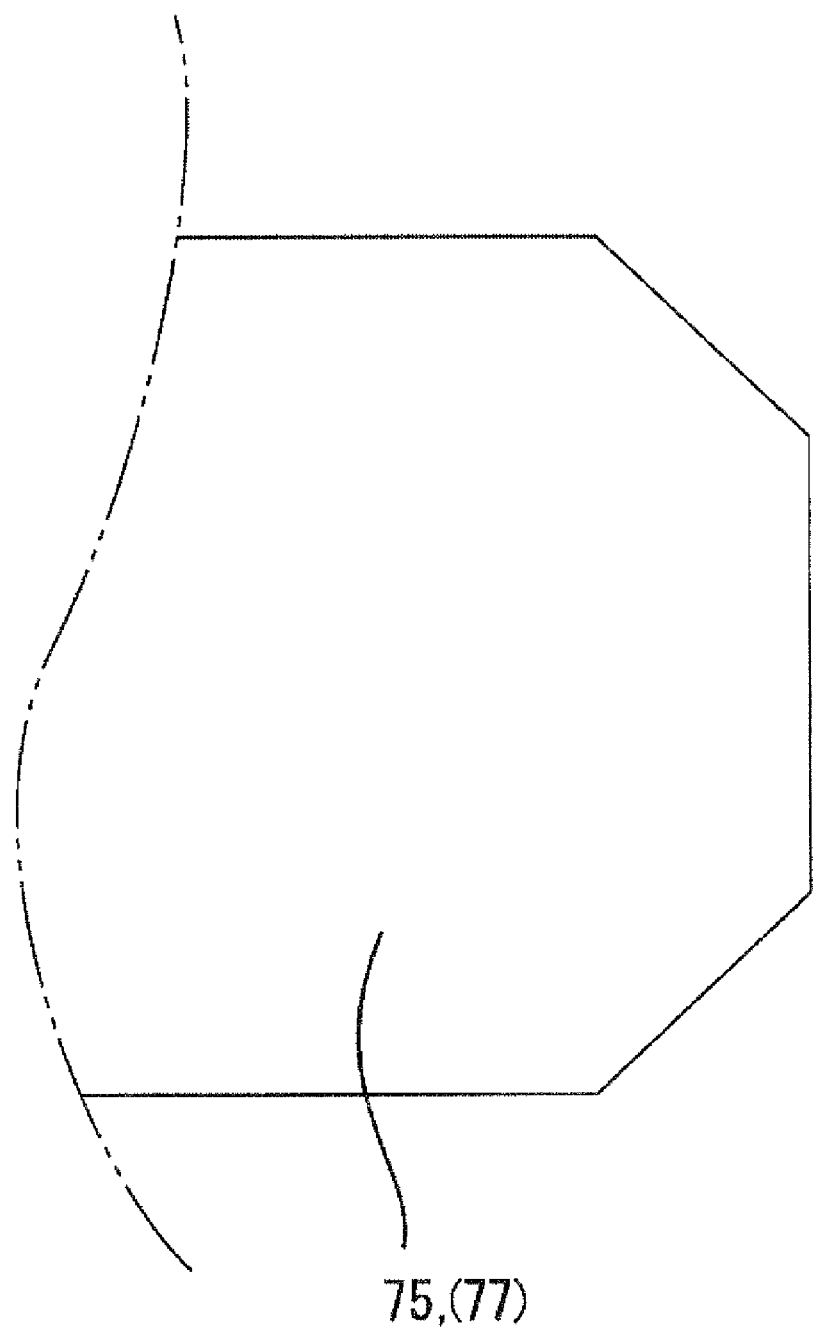
FIG. 16 is a diagram showing an example of modification.

(1) Although each of the corners of the front end of the feeder 50 in the first embodiment is formed in an arc shape, the front end of the feeder 50 may have any other suitable shape tapered frontwardly. For example, as shown in FIG. 16, each corner may be obliquely cut off (chamfered) to form the front end of the feeder 50 in a tapered shape.

Figure 17:
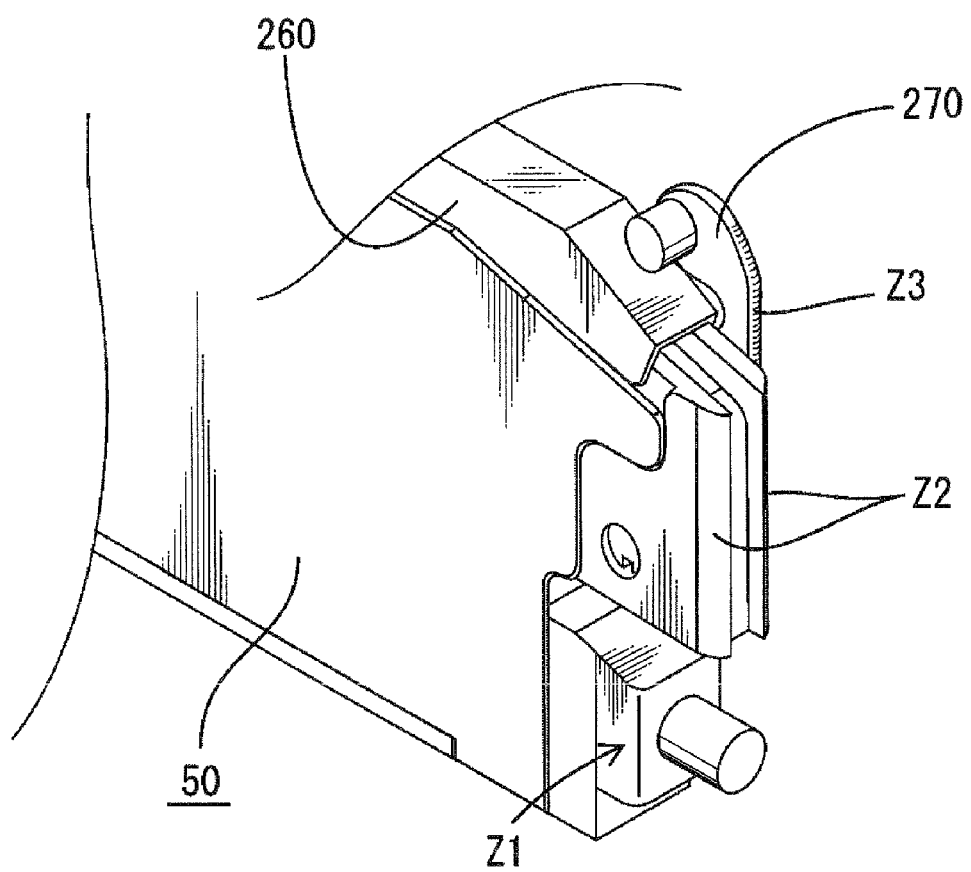
FIG. 17 is a diagram showing an example of modification.
Figure 18:
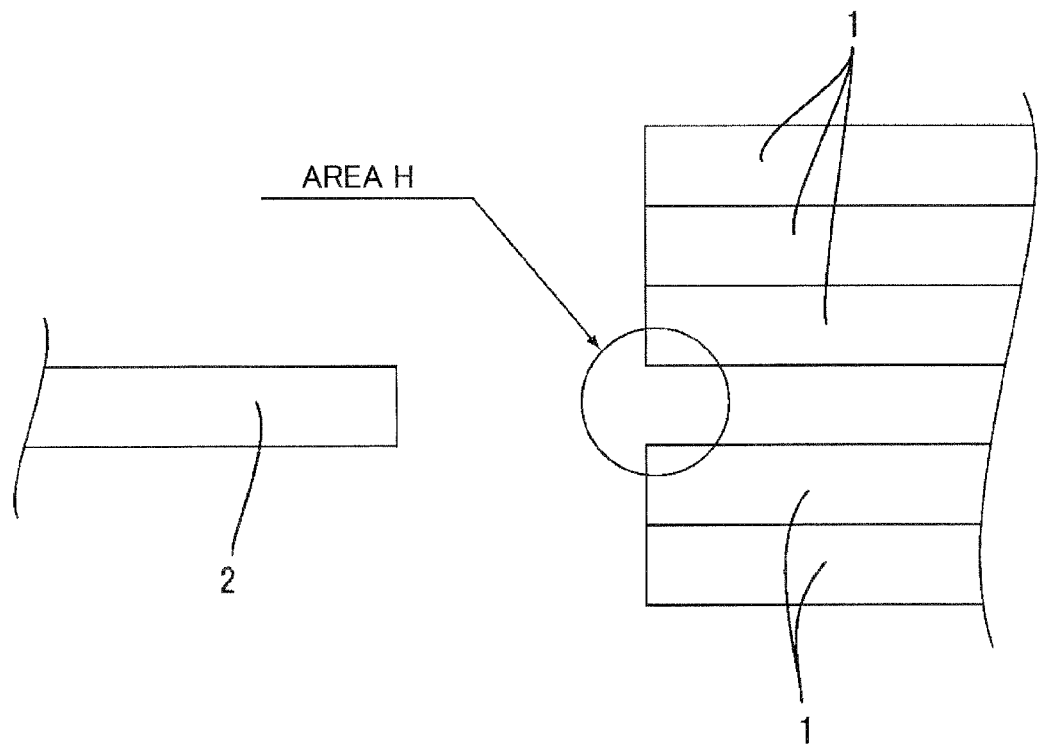
FIG. 18 is a diagram showing an example of a conventional component supply apparatus.

(2) FIG. 17 shows one example of modification of the shape of the front end of the feeder 50. In a feeder 50 having a front end with a shape as shown in FIG. 17, the portion Z1, Z2 as well as the portion Z3 is preferably rounded. In this case, corners of all members located at the front end of the feeder 50 are rounded. This is advantageous in regard to safety, and makes it possible to effectively prevent the front end from being caught by other member during an installation operation for the feeder 50. In FIG. 17, the reference numeral 270 indicates a pressing member for pressing a tape holder 260.

(3) Although the first to third embodiments have been described based on one example where the guide portion is made up of a part of structural members (such as the housing) originally equipped in the feeder 50, it is understood that the guide portion may be made up of an additionally-prepared exclusive member.

In the last place, elements of the present invention disclosed based on the above embodiments and advantages thereof will be described in a summarized manner.

The present invention provides a component supply apparatus for supplying components from each of a plurality of component-supplying tape feeders adapted to be installed to a feeder installation section while being arranged side-by-side in a conveyance direction of a conveyer provided in a surface mounter, wherein each of the tape feeders is formed in a shape elongated in one direction to allow the installation thereof to be performed in such a manner that it is inserted and pulled out relative to the feeder installation section, along a longitudinal direction thereof, and wherein a trailing one of longitudinally opposite ends of each of the tape feeders in an insertion direction is provided with a guide portion for guiding installation of one of the tape feeders to be installed to the feeder installation section in adjacent relation to ones of the remaining tape feeders.

In the present invention, the guide portion is provided in the trailing end of each of the tape feeders in the insertion direction, to guide installation of one of the tape feeders to be installed to the feeder installation section in adjacent relation to ones of the remaining tape feeders. This makes it possible to smoothly install the tape feeder to the feeder installation section so as to provide enhanced efficiency in a tape-feeder replacement operation.

The following configurations are preferable as an embodiment of the present invention.

The guide portion is provided on each of widthwisely opposite sides of the tape feeder.

The guide portion is formed by rounding corners of the trailing end of each of the tape feeders.

A size of the roundness is set to be one-third or more of a width dimension of the tape feeder.

The guide portion is formed by bending the trailing end of each of the tape feeders inwardly in a widthwise direction of the tape feeder.

A leading one of the longitudinally opposite ends of each of the tape feeders in the insertion direction is rounded.

According to the above configurations, the efficiency in the tape-feeder replacement operation can be more enhanced.

The invention claimed is:

1. A component supply apparatus for supplying components from each of a plurality of component-supplying tape feeders adapted to be installed to a feeder installation section while being arranged side-by-side in a conveyance direction of a conveyer provided in a surface mounter,
wherein each of the tape feeders is formed in a shape elongated in one direction to allow the installation thereof to be performed in such a manner that it is inserted and pulled out relative to the feeder installation section, along a longitudinal direction thereof,
and wherein a trailing one of longitudinally opposite ends of each of the tape feeders in an insertion direction is provided with a guide portion for guiding installation of one of the tape feeders to be installed to the feeder installation section in adjacent relation to ones of the remaining tape feeders, and wherein the guide portions of two tape feeders to be located on both sides of one tape feeder form an insertion port having a width dimension between the trailing ends of the two tape feeders, increasing toward the rearmost edges of the two tape feeders.

2. The component supply apparatus as defined in claim 1, wherein the guide portion is provided on each of widthwisely opposite sides of the tape feeder.

3. The component supply apparatus as defined in claim 1, wherein the guide portion is formed by rounding corners of the trailing end of each of the tape feeders.

4. The component supply apparatus as defined in claim 3, wherein a size of the roundness is set to be one-third or more of a width dimension of the tape feeder.

5. The component supply apparatus as defined in claim 1, wherein the guide portion is formed by bending the trailing end of each of the tape feeders inwardly in a widthwise direction of the tape feeder.

6. The component supply apparatus as defined in claim 1, wherein a leading one of the longitudinally opposite ends of each of the tape feeders in the insertion direction is rounded.

7. A surface mounter comprising the component supply apparatus as defined in claim 1, and a head unit adapted to pick up the component from the component supply apparatus and transferring the component onto a board.

* * * * *